United States Patent
Hanyu et al.

(10) Patent No.: US 7,713,612 B2
(45) Date of Patent: May 11, 2010

(54) HARD MULTILAYER COATING, AND HARD MULTILAYER COATED TOOL INCLUDING THE HARD MULTILAYER COATING

(75) Inventors: Hiroyuki Hanyu, Toyokawa (JP); Takaomi Toihara, Toyokawa (JP)

(73) Assignee: OSG Corporation, Toyokawa-shi (JP)

( * ) Notice: Subject to any disclaimer, the term of this patent is extended or adjusted under 35 U.S.C. 154(b) by 53 days.

(21) Appl. No.: 11/659,338

(22) PCT Filed: Sep. 7, 2005

(86) PCT No.: PCT/JP2005/016403

§ 371 (c)(1), (2), (4) Date: Feb. 28, 2007

(87) PCT Pub. No.: WO2006/059416

PCT Pub. Date: Jun. 8, 2006

(65) Prior Publication Data

US 2008/0124531 A1  May 29, 2008

(51) Int. Cl.
*B32B 9/00* (2006.01)

(52) U.S. Cl. .......................... 428/216; 51/307; 51/309; 428/336; 428/697; 428/698; 428/699

(58) Field of Classification Search .................. 51/307, 51/309; 428/216, 336, 697, 698, 699
See application file for complete search history.

(56) References Cited

U.S. PATENT DOCUMENTS

| | | | |
|---|---|---|---|
| 6,220,797 B1 * | 4/2001 | Ishii et al. | 428/698 |
| 6,492,011 B1 * | 12/2002 | Brandle et al. | 428/336 |
| 7,008,688 B2 * | 3/2006 | Toihara | 428/216 |
| 7,217,466 B2 * | 5/2007 | Weber et al. | 428/697 |
| 2002/0132141 A1 | 9/2002 | Toihara | |
| 2004/0005981 A1 | 1/2004 | Weber et al. | |

FOREIGN PATENT DOCUMENTS

| | | |
|---|---|---|
| DE | 199 27 478 A1 | 3/2000 |
| DE | 102 10 839 A1 | 9/2002 |
| DE | 102 12 383 A1 | 10/2003 |
| GB | 2 338 915 A | 1/2000 |
| JP | A 7-205362 | 8/1995 |
| JP | A 9-104965 | 4/1997 |
| JP | A 2002-030413 | 1/2002 |
| JP | A 2002-275618 | 9/2002 |
| WO | WO 00/14300 A1 | 3/2000 |

* cited by examiner

*Primary Examiner*—Archene Turner
(74) *Attorney, Agent, or Firm*—Oliff & Berridge, PLC (57) ABSTRACT

A hard multilayer coating including: (a) a backing layer which is to be disposed on a body and which includes a TiAlN layer and a TiAlN+CrN mixture layer that are alternately superposed on each other; and (b) a CrN layer which is disposed on the backing layer and which provides an outer surface of the hard multilayer coating. The hard multilayer coating may further includes (c) an intermediate layer which is interposed between the backing layer and the CrN layer. Also disclosed is a hard multilayer coated tool including a tool substrate as the body which is coated with the hard multilayer coating.

10 Claims, 6 Drawing Sheets

(a) TEST CONDITIONS

| DISK | S45C |
|---|---|
| PIN | R5 |
| LOAD | 200g |
| VELOCITY | 333mm/sec |
| ATMOSPHERE, ROOM TEMPERATURE 25°C, HUMIDITY 50% | |

(b) FRICTION COEFFICIENT CURVES (c) FRICTION COEFFICIENT AT HIGH TEMPERATURE (400°C)

| TiAlN | 0.7 |
|---|---|
| CrN | 0.25 |

FIG. 5

(a) CUTTING CONDITIONS

```
CUTTING C1100
TOOL    CEMENTED CARBIDE BALL ENDMILL R1.5
WORK MATERIAL   C1100
CUTTING VELOCITY   19000min-1 (179m/min)
FEED RATE   2900mm/min (0.076mm/t)
aa=0.15mm
ar=0.45mm
MACHINING WITH PICK FEED (=ar)
CUTTING FEED   WATER SOLUBLE
```

(b) WEAR WIDTH AFTER CUTTING FOR 400m

|  | CONSTRUCTION OF BACKING LAYER | THICKNESS OF BACKING LAYER | THICKNESS OF INTERMEDIATE LAYER | THICKNESS OF CrN LAYER | TOTAL THICKNESS | VB WEAR WIDTH |
|---|---|---|---|---|---|---|
| INVENTION PRODUCTS | TiAlN/ TiAlN+CrN MULTILAYER | 2 | 0.1 | 1.9 | 4 | 0.041 |
| | | 2 | 0.5 | 2.5 | 5 | 0.035 |
| | | 3 | 0.1 | 2.9 | 6 | 0.036 |
| | | 3 | 0.5 | 2.5 | 6 | 0.035 |
| | | 3 | 0 | 3 | 6 | 0.049 |
| | | 4 | 0.1 | 2.9 | 7 | 0.038 |
| | | 4 | 0.5 | 2.5 | 7 | 0.04 |
| | | 4 | 0 | 2 | 6 | 0.048 |
| COMPARATIVE PRODUCTS | TiAlN/ TiAlN+CrN MULTILAYER | 0.5 | 0.1 | 1.9 | 2.5 | 0.067 |
| | | 0.5 | 0.5 | 2 | 3 | 0.067 |
| | | 2 | 0 | 0.05 | 2.05 | 0.079 |
| | | 4 | 0 | 0 | 4 | 0.093 |
| | TiAlN MONOLAYER | 2 | 0.1 | 1.9 | 4 | 0.078 |
| | | 2 | 0.5 | 1.5 | 4 | 0.088 |
| | | 3 | 0 | 0 | 3 | 0.098 |
| | NO BACKING LAYER | 0 | 0 | 4 | 4 | 0.065 |

(a) CUTTING CONDITIONS

```
CUTTING S50C
TOOL  CEMENTED CARBIDE BALL ENDMILL R3
WORK MATERIAL  S50C
CUTTING VELOCITY  10600min-1 (199.7m/min)
FEED RATE  2570mm/min (0.121mm/t)
aa=0.3mm
ar=0.6mm
MACHINING WITH PICK FEED (=ar)
CUTTING FLUID  AIR BLOW
```

(b) WEAR WIDTH AFTER CUTTING FOR 56m

|  | CONSTRUCTION OF BACKING LAYER | THICKNESS OF BACKING LAYER | THICKNESS OF INTERMEDIATE LAYER | THICKNESS OF CrN LAYER | TOTAL THICKNESS | VB WEAR WIDTH |
|---|---|---|---|---|---|---|
| INVENTION PRODUCTS | TiAlN/ TiAlN+CrN MULTILAYER | 2 | 0.1 | 1.9 | 4 | 0.063 |
|  |  | 2 | 0.5 | 2.5 | 5 | 0.065 |
|  |  | 3 | 0.1 | 2.9 | 6 | 0.065 |
|  |  | 3 | 0.5 | 2.5 | 6 | 0.07 |
|  |  | 3 | 0 | 3 | 6 | 0.071 |
|  |  | 4 | 0.1 | 2.9 | 7 | 0.074 |
|  |  | 4 | 0.5 | 2.5 | 7 | 0.068 |
|  |  | 4 | 0 | 2 | 6 | 0.078 |
| COMPARATIVE PRODUCTS | TiAlN/ TiAlN+CrN MULTILAYER | 0.5 | 0.1 | 1.9 | 2.5 | 0.131 |
|  |  | 0.5 | 0.5 | 2 | 3 | 0.125 |
|  |  | 2 | 0 | 0.05 | 2.05 | 0.086 |
|  |  | 4 | 0 | 0 | 4 | 0.091 |
|  | TiAlN MONOLAYER | 2 | 0.1 | 1.9 | 4 | 0.091 |
|  |  | 2 | 0.5 | 1.5 | 4 | 0.088 |
|  |  | 3 | 0.2 | 1.8 | 5 | 0.082 |
|  | NO BACKING LAYER | 0 | 0 | 4 | 4 | 0.24 |

(μm)

HARD MULTILAYER COATING, AND HARD MULTILAYER COATED TOOL INCLUDING THE HARD MULTILAYER COATING

TECHNICAL FIELD

The present invention relates in general to a hard multilayer coating, and more particularly to such a hard multilayer coating that has high lubricity (welding resistance) in addition to excellent wear resistance and tenacity.

BACKGROUND ART

There is proposed a hard multilayer coated tool that is constituted by (i) a tool substrate made of high-speed tool steel or cemented carbide and (ii) a hard multilayer coating disposed on a surface of the tool substrate. The hard multiplayer coating includes a TiAlN layer and a mixture layer of TiAlN+CrN that are alternately superposed on each other. As an example of the hard multilayer coated tool, Patent Document 1 discloses a rotary cutting tool including a TiAlN layer and a mixture layer that are alternately superposed on each other, wherein the TiAlN layer has a high hardness while the mixture layer includes CrN whose hardness is relatively low. In the disclosed rotary cutting tool, an excellent wear resistance is obtained owing to presence of the TiAlN layer having the high hardness, while an increased tenacity is obtained owing to presence of the mixture layer including CrN whose hardness is relatively low, so that chipping and peeling of the coating is restrained whereby durability of the tool is substantially increased.

Patent Document 1: JP-2002-275618A

DISCLOSURE OF INVENTION

Object to be Solved by the Invention

However, due to a relatively high coefficient of friction of the above-described TiAlN layer, where the cutting tool is used for cutting a workpiece that is made of an easily weldable material such as copper and copper alloy, welding between the cutting tool and the workpiece could be easily caused due to the high coefficient of friction of the TiAlN layer. The welding deteriorates the cutting performance such as machining accuracy, and causes wear on the cutting tool in an early stage, thereby making it impossible to obtain desired durability of the cutting tool. For example, in a cutting operation with the rotary cutting tool such as ball endmill and drill, the welding is easily caused, particularly, in a portion of the rotary cutting tool that tends to come into friction contact with the workpiece, such as a portion around the axis of rotation and a portion constituting each rake face.

The present invention was made in the light of the background art discussed above. It is therefore an object of the invention to improve a resistance against welding in a hard multilayer coating that is constituted principally by TiAlN.

Measures for Achieving the Object

For achieving the above object, the first invention provides a hard multilayer coating characterized by consisting of (a) a backing layer disposed on a predetermined body and including a TiAlN layer and a mixture layer of TiAlN+CrN that are alternately superposed on each other; (b) an intermediate layer disposed on the backing layer and consisting of a mixture layer of TiAlN+CrN; and (c) a CrN layer disposed on the intermediate layer and providing a surface of the hard multilayer coating.

The second invention is, in the hard multilayer coating of the first invention, characterized in that: the backing layer has a thickness of from 2 μm to 8 μm; the intermediate layer has a thickness of from 0.1 μm to 5 μm; the CrN layer has a thickness of from 0.1 μm to 5 μm; and an entire thickness of the hard multilayer coating is not larger than 10 μm.

The third invention provides a hard multilayer coating characterized by consisting of (a) a backing layer disposed on a predetermined body and including a TiAlN layer and a mixture layer of TiAlN+CrN that are alternately superposed on each other; and (b) a CrN layer disposed on the backing layer and providing a surface of the hard multilayer coating.

The fourth invention is, in the hard multilayer coating of the third invention, characterized in that: the backing layer has a thickness of from 2 μm to 8 μm; the CrN layer has a thickness of from 0.1 μm to 8 μm; and an entire thickness of the hard multilayer coating is not larger than 10 μm.

The fifth invention is, in the hard multilayer coating of any one of the first through fourth inventions, characterized in that each of a lowermost layer and an uppermost layer of the backing layer is provided by the TiAlN layer.

The sixth invention is, in the hard multilayer coating of any one of the first through fifth inventions, characterized in that the hard multilayer coating is to be disposed on a surface of a cutting tool.

The seventh invention provides a hard multilayer coated tool characterized in that the hard multilayer coated tool is covered at a surface thereof with the hard multilayer coating of any one of the first through fifth inventions.

Effects of the Invention

In the hard multilayer coating of each of the first through sixth inventions, owing to presence of the backing layer including the TiAlN layer and the mixture layer of TiAlN+CrN that are alternately superposed on each other, it is possible to obtain excellent wear resistance and tenacity. Further, since the CrN layer constitutes an uppermost portion of the hard multilayer coating and providing the surface of the hard multilayer coating has a low coefficient of friction, it is possible to improve lubricity and welding resistance. Further, since an oxidation initiation temperature of the CrN layer is as high as about 700° C., excellent characteristics of the coating are stably maintained even in an environment of high temperature.

Therefore, where such a hard multilayer coating is applied to a rotary cutting tool such as a ball endmill, it is possible to obtain excellent cutting performance and durability in a wide range of use, for example, from a case of cutting a workpiece made of ferrous or non-ferrous (e.g., copper alloy) material having a low hardness and easily weldable, to a case of cutting a workpiece made of a high hardness material such as heat treated steel having a hardness of about 50 HRC. Specifically described, owing to presence of the CrN layer, it is possible to restrain wear on each rake face and to restrain change of the rake angle toward the negative side in a late stage of the cutting operation, so that a cutting capacity is satisfactorily maintained for a long term, thereby improving the durability of the tool and stabilizing the quality of the finished surface of the workpiece. The rotary cutting tool such as a ball endmill has a distal end portion which is located around its axis of rotation, and the workpiece is easily weldable to the distal end portion due to a low cutting capacity of the distal end portion. However, owing to the presence of the CrN layer, the welding can be restrained whereby the cutting performance and the durability can be satisfactorily maintained. Further, since the excellent characteristics of the coating can be stably obtained even in the environment of high temperature, the cutting tool is capable of carrying out a cutting operation with high efficiency under a tough cutting condition with a high temperature caused by, for example, frictional heat.

Further, in the first invention, since the intermediate layer consisting of the mixture layer of TiAlN+CrN (including CrN) is interposed between the backing layer and the CrN layer, the CrN layer is superposed on the intermediate layer with high adhesiveness, so that chipping and peeling of the CrN layer can be further advantageously restrained.

In the fifth invention in which each of the lowermost layer and the uppermost layer of the backing layer is provided by the TiAlN layer, the backing layer can be adhered to the predetermined body (e.g., tool substrate) with excellent adhesiveness owing to the TiAlN layer providing the lowermost layer, while the backing layer can have excellent wear resistance owing to the TiAlN layer providing the uppermost layer. Since the CrN layer is disposed on the TiAlN layer as the uppermost layer directly or through the intermediate layer, the TiAlN layer having the high hardness is not brought into direct contact with the workpiece. However, the TiAlN layer serves to restrain deformation of the CrN layer, so that wear resistance of the CrN layer is improved.

In the hard multilayer coated tool of the seventh invention, it is possible to obtain substantially the same effect as in the first through fifth inventions.

DESCRIPTION OF REFERENCE SIGNS

10: ball endmill (hard multilayer coated tool) 12: tool substrate (body) 20, 28: hard multilayer coating 22: backing layer 22a: TiAlN layer 22b: mixture layer 24: intermediate layer 26: CrN layer

BEST MODE FOR CARRYING OUT THE INVENTION

The present invention may be advantageously applied to a hard multilayer coating to be provided to cover a substrate of a rotary cutting tool (e.g., end mill, drill and tap) having cutting edges. However, the present invention may be applied also to any other machining tool such as a non-rotary cutting tool (e.g., replaceable insert that is fixed to a tool holder used for a lathe operation) and a cold-forming tool which is designed to form a workpiece into a desired shape by plastically deforming the workpiece. In addition, it may be applied also to a hard multilayer coating to be provided as a surface-protecting coating to cover a body or member (e.g., electronic component) which is other than the machining-tools. It is noted that the substrate of the machining tool, which is to be coated with the hard multilayer coating, is preferably made of a cemented carbide or a high-speed tool steel. However, the tool substrate may be made of any other metallic material.

As a method of forming the hard multilayer coating according to the present invention, an arc ion plating method is advantageously employed. However, it is possible to employ other physical vapor deposition (PVD) method such as a sputtering method, or alternatively, a chemical vapor deposition (CVD) method such as a plasma CVD method and a thermal CVD method.

It is preferable that the entire thickness of the hard multilayer coating of the present invention is not larger than 10 μm, since the coating would be easily peeled from the body if the entire thickness is larger than 10 μm. Further, where the body has cutting edges, the entire thickness being larger than 10 μm would cause the cutting edges to be rounded, thereby deteriorating the cutting performance. It is preferable that the thickness of the backing layer is not smaller than 2 μm, since it is not possible to obtain satisfactory coating performance and strength such as sufficient wear resistance, heat resistance and tenacity if the thickness of the backing layer is smaller than 2 μm. Further, it is appropriate that the thickness of the backing layer is not lager than 8 μm in order that the entire thickness of the hard multiplayer coating is not larger than 10 μm.

It is appropriate that the thickness of the TiAlN layer included in the backing layer is from 160 nm to 2000 nm, and that the thickness of the TiAlN+CrN mixture layer included in the backing layer is from 10 nm to 1000 nm, so that the wear resistance can be maintained owing to the TiAlN layer while the chipping and peeling are effectively prevented owing to the TiAlN+CrN mixture layer. Where the backing layer includes a plurality of TiAlN layers and a plurality of TiAlN+CrN mixture layers, the TiAlN layers may have respective thicknesses equal to each other while the TiAlN+CrN mixture layers may have the respective thicknesses equal to each other. However, the TiAlN layers and the TiAlN+CrN mixture layers may take any one of various arrangements such as an arrangement in which the thicknesses of the TiAlN layers or the TiAlN+CrN mixture layers are different from each other such that the thickness of the layer is continuously changed. It is preferable that a mixed crystal ratio between Ti and Al in the TiAlN layer included in the backing layer is in a range from about 2:8 (=Ti:Al) to about 6:4 (=Ti:Al). A mixed crystal ratio between Ti and Al in TiAlN of the TiAlN+CrN mixture layer, which is included in the backing layer or provides the intermediate layer, may be substantially the same as the mixed crystal ratio in the TiAlN layer, but does not have to be necessarily the same as the mixed crystal ratio in the TiAlN layer.

It is preferable that a total number of the TiAlN and TiAlN+ CrN mixture layers superposed on each other and constituting the backing layer is at least three such that each of the lowermost and uppermost layers of the backing layer is provided by the TiAlN layer. However, the uppermost layer of the backing layer may be provided by the TiAlN+CrN, mixture layer, for example, where the thickness of the TiAlN+CrN mixture layer is so small as several tens of nm. In such a case, the TiAlN+CrN mixture layer providing the uppermost layer may be used as the intermediate layer, although the intermediate layer consisting of another TiAlN+CrN mixture layer may be provided in addition to the TiAlN+CrN mixture layer providing the uppermost layer. The third invention encompass not only an arrangement in which the uppermost layer of the backing layer on which the CrN layer is directly disposed is provided by the TiAlN layer but also an arrangement in which the uppermost layer of the backing layer on which the CrN layer is directly disposed is provided by the TiAlN+CrN mixture layer.

It is appropriate that the thickness of the intermediate layer is not smaller than 0.1 μm, since sufficient adhesiveness among the layers cannot be obtained if the thickness of the intermediate layer is smaller than 0.1 μm. It is appropriate that the thickness of the CrN layer constituting an uppermost portion of the hard multilayer coating is not smaller than 0.1 μm, since sufficient lubricity cannot be obtained if the thickness of the CrN layer is smaller than 0.1 μm. It is preferable that the thickness of the CrN layer is not smaller than 0.5 μm. In order that the entire thickness of the hard multiplayer coating is not larger than 10 μm, it is appropriate that each of the thickness of the intermediate layer and the thickness of the CrN layer is not larger than 5 μm where the hard multiplayer coating has the intermediate layer, and that the thickness of the CrN layer is not larger than 8 μm where the hard multiplayer coating does not have the intermediate layer. In order that the hard multiplayer coating has desired coating strength and performance, it is appropriate that the entire thickness of the hard multiplayer coating is not smaller than 2.1 μm while the thickness of the backing layer is not smaller than 2 μm where the hard multiplayer coating does not have the intermediate layer, and that the entire thickness of the hard multiplayer coating is not smaller than 2.2 μm where the hard multiplayer coating has the intermediate layer. It is preferable that the entire thickness of the hard multiplayer coating is not smaller than 2.5 μm where the hard multiplayer coating has the intermediate layer.

Each of the mixture layer of the backing layer and the intermediate layer is provided by the TiAlN+CrN mixture layer. Although the mixture layer of the backing layer and the intermediate layer can be constituted by exactly the same composition, they may be positively made different from each other with respect to their compositions and characteristics, for example, by changing layer forming conditions such as the mixed crystal ratio between Ti and Al, mixing ratio between TiAlN and CrN, and arc current and bias voltage applied upon layer formation.

In the present invention, the CrN layer is provide to constitute the uppermost portion of the hard multilayer coating. However, in the first invention in which the intermediate layer containing CrN is provided, it is possible to expect effect for some improvement in the lubricity even if the intermediate layer is arranged to constitute the uppermost portion of the hard multilayer coating without provision of the CrN layer.

Each of the TiAlN layer, the TiAlN+CrN mixture layer (including the intermediate layer) and the CrN layer may contain carbon or other element in addition to inevitable impurity element, as long as the contained other element does not impede a desired effect favorable to the wear resistance, tenacity, adhesiveness, heat resistance and welding resistance which are characteristics required to the hard multilayer coating, namely, as long as the contained other element does not considerably deteriorate these characteristics. For example, not only pure nitride of chromium but also CrCN that is carbonitride containing C (carbon) may be used as CrN. Further, not only pure nitride of TiAl but also TiAlCN that is carbonitride containing C (carbon) may be used as TiAlN.

Embodiments

There will be described in detail embodiments of the present invention, with reference to the drawings.

Figure 1:
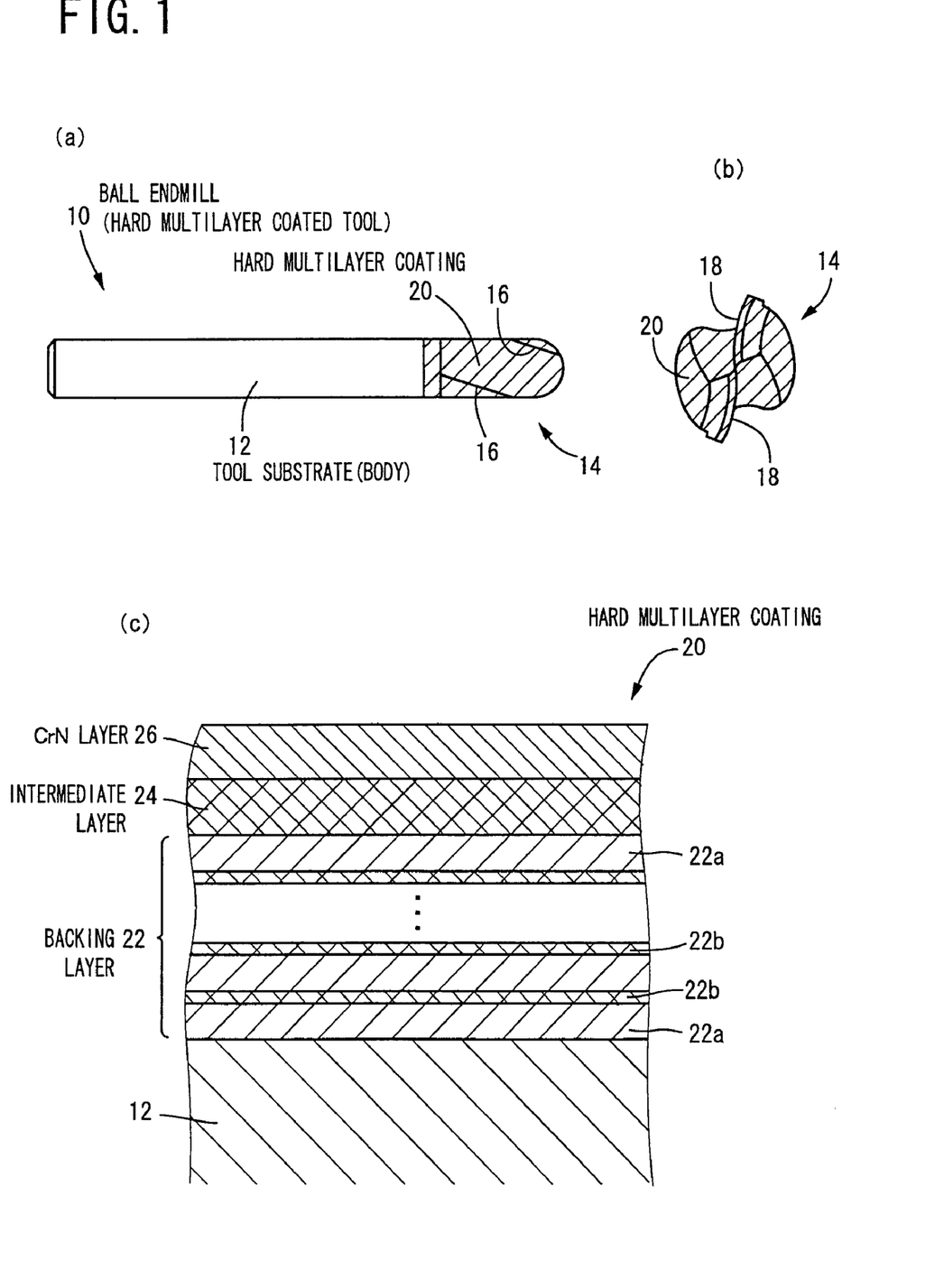
[FIG. 1] A set of views showing an endmill that is one embodiment of the present invention, wherein view (a) is a front view as seen in a direction perpendicular to an axis of the endmill, view (b) is an enlarged bottom view, and view (c) is a cross sectional view of a layered portion of a cutting teeth portion that is provided with a hard multilayer coating.

FIG. 1 is a set of views showing a ball endmill 10 that is one example of a hard-multilayer-coated rotary cutting tool to which the present invention is applied, wherein view (a) is a front view as seen in a direction perpendicular to an axis of the ball endmill 10, and view (b) is an enlarged bottom view as seen from side of a distal end of the ball endmill 10 (as seen from a right side of the ball endmill 10 in view (a)). The ball endmill 10 includes a tool substrate 12 made of cemented carbide. The tool substrate 12 has a cutting teeth portion 14 and a shank portion that are formed integrally with each other. The cutting teeth portion 14 is provided with cutting edges in the form of a pair of peripheral cutting edges 16 and a pair of ball-nosed end cutting edges 18, which are arranged to be symmetrical with each other with respect to the axis, so that a cutting operation can be carried out by the peripheral cutting edges 16 and the ball-nosed end cutting edges 18 while the ball endmill 10 is being rotated about the axis. The cutting teeth portion 14 is coated at its surface with a hard multilayer coating 20 that is represented by an oblique-lined portion in views (a), (b) of FIG. 1. View (c) of FIG. 1 is a cross sectional view of a layered portion of the cutting teeth portion 14 that is coated with the hard multilayer coating 20. The ball endmill 10 corresponds to a hard multilayer coated tool, while the tool substrate 12 corresponds to a predetermined body on which the hard multilayer coating 20 is disposed.

As is apparent from view (c) of FIG. 1, the hard multilayer coating 20 is constituted by a backing layer 22, an intermediate layer 24 and a CrN layer 26 that constitutes an outer surface and an uppermost portion of the hard multilayer coating 20. The hard multilayer coating 20 has an entire thickness of from 2.2 μm to 10 μm. The backing layer 22 consists of at least three layers which include TiAlN layers 22a and TiAlN+ CrN mixture layers 22b and which are alternately superposed on each other. The backing layer 22 has a thickness of from 2 μm to 8 μm. Each of the TiAlN layers 22a has an average thickness of from 160 nm to 2000 nm, while each of the mixture layers 22b has an average thickness of from 10 nm to 1000 nm. In the present embodiment, the TiAlN layers 22a having the same thickness and the mixture layers 22b having the same thickness are alternately superposed on each other. Each of the mixture layers 22b is a layer in which TiAlN and CrN are mixed with a predetermined proportion therebetween. A mixed crystal ratio between Ti and Al in TiAlN of the TiAlN layers 22a and the mixture layers 22b is in a range from 2:8 (=Ti:Al) to 6:4 (=Ti:Al). In the present embodiment, the mixed crystal ratio between Ti and Al is 4:6 (=Ti:Al). Each of the uppermost and lowermost layers of the backing layer 22 is provided by the TiAlN layer 22a. The total number of the TiAlN and mixture layers 22a, 22b is an odd number that is not smaller than three.

TiAlN has a hardness (Hv) of about from 2300 to 3000, while CrN has a hardness (Hv) of about from 1800 to 2300. Each mixture layer 22b containing TiAlN and CrN has a hardness that is lower than a hardness of each TiAlN layer 22a containing only TiAlN. Therefore, in the backing layer 22 in which the TiAlN layers 22a having the high hardness and the mixture layers 22b having the relatively low hardness are alternately superposed on each other, an excellent wear resistance is obtained owing to presence of the TiAlN layers 22a having the high hardness, while an increased tenacity is obtained owing to presence of the mixture layer 22b having the low hardness, thereby reducing risk of chipping and peeling of the coating 20. As described above, the average thickness of each TiAlN layer 22a is from 160 nm to 2000 nm, the average thickness of each mixture layer 22b is from 10 nm to 1000 nm, and the entire thickness of the backing layer 22 is from 2 μm to 8 μm, so that the wear resistance can be maintained owing to the TiAlN layers 22a while the chipping and peeling can be effectively prevented owing to the mixture layers 22b.

The intermediate layer 24 is a mixture layer in which TiAlN and CrN are mixed to each other. In the present embodiment, the intermediate layer 24 is the same as the mixture layers 22b with respect to composition. The intermediate layer 24 is disposed on the backing layer 22, described more specifically, is disposed to be contiguous to the TiAlN layer 22a as the uppermost layer of the backing layer 22. The thickness of the intermediate layer 24 is from 0.1 μm to 5 μm. Thus, the intermediate layer 24 of TiAlN+CrN is disposed on the backing layer 24, i.e., on the uppermost TiAlN layer 22a, before disposition of the CrN layer 26, whereby the adhesiveness of the CrN layer 26 with respect to the backing layer 22 is improved. A mixed crystal ratio between Ti and Al in TiAlN of the intermediate layer 24 is in a range from 2:8 (=Ti:Al) to 6:4 (=Ti:Al). In the present embodiment, the mixed crystal ratio between Ti and Al is 4:6 (=Ti:Al).

The CrN layer 26 is disposed on and contiguous to the intermediate layer 24, and has a thickness of from 0.1 μm to 5 μm. CrN constituting the CrN layer 26 has a coefficient of friction lower than that of TiAlN. Therefore, owing to the CrN layer 26 provided to constitute the outer surface and the uppermost portion of the hard multilayer coating 20, it is possible to improve lubricity between the coating 20 and a workpiece, namely, improve resistance to welding between the coating 20 and the workpiece.

Figure 4:
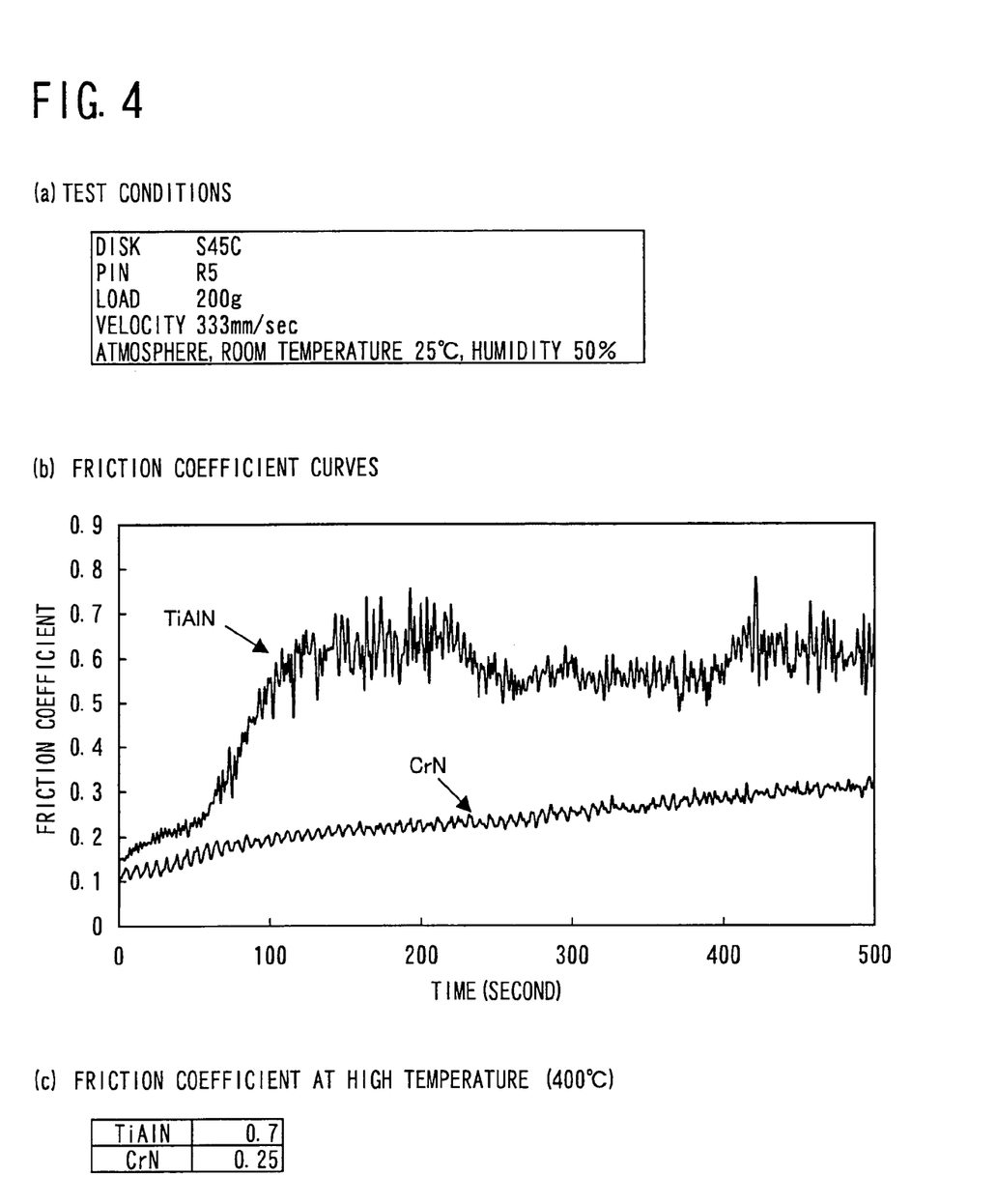
[FIG. 4] A set of views showing result of measurement of friction coefficients of CrN and TiAlN in comparison with each other, wherein the measurement was made according to ball-on-disk method.

FIG. 4 is a set of views showing result of measurement of friction coefficients of CrN and TiAlN that was made according to ball-on-disk method, which is substantially the same as a test method defined in JIS R1613. In FIG. 4, view (a) shows conditions of the test, and view (b) shows a result of the test. Friction coefficient curves of the view (b) represents a change of each of the friction coefficients in an initial period. The friction coefficient of TiAlN is converged within a range about from 0.5 to 0.7, while the friction coefficient of CrN is converged to about 0.3. Further, view (c) of FIG. 4 shows the friction coefficients measured at a high temperature (400° C.). The friction coefficient of TiAlN measured at the high temperature is about 0.7, while the friction coefficient of CrN measured at the high temperature is about 0.25. Thus, the friction coefficients measured at the high temperature are substantially the same as those measured at a room temperature (25° C.) and shown in view (b) of FIG. 4. It is noted that the friction coefficients shown in view (c) of FIG. 4 were measured at the same test conditions as those shown in view (a) of FIG. 4 except that the temperature was 400° C.

Figure 2:
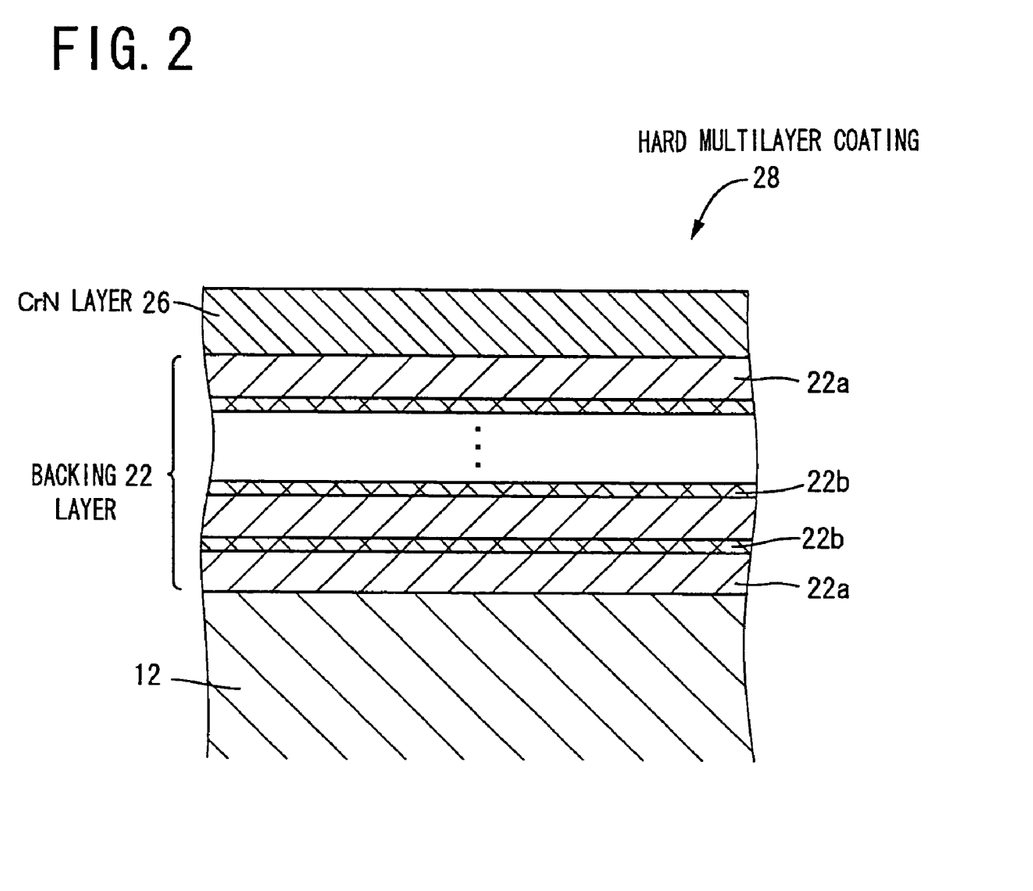
[FIG. 2] A cross sectional view showing a hard multilayer coating as another example that is different from the hard multilayer coating shown in view (c) of FIG. 1.

Although the above-described hard multilayer coating 20 includes the intermediate layer 24, the CrN layer 26 may be disposed directly on the backing layer 22 with the intermediate layer 24 being omitted, as in a hard multilayer coating 28 of FIG. 2. In this case, the backing layer 22 may have substantially the same construction as in the hard multilayer coating 20, and the thickness of the CrN layer 26 can be increased owing to absence of the intermediate layer 24. Thus, the thickness of the CrN layer 26 may be from 0.1 μm to 8 μm.

TiAlN contained in the TiAlN layers 22a and the mixture layers 22b of the backing layer 22 and the intermediate layer 24 is pure nitride of TiAl that does not include carbon. However, the pure nitride of TiAl is replaced by TiAlCN that is carbonitride containing carbon whose amount is determined such that the hardness, adhesiveness and other characteristic are not deteriorated. CrN contained in the mixture layers 22b of the backing layer 22, the intermediate layer 24 and the CrN layer 26 is pure nitride of chromium that does not include carbon. However, the pure nitride of chromium is replaced by CrCN that is carbonitride containing carbon whose amount is determined such that the lubricity, heat resistance and other characteristic are not deteriorated.

Figure 3:
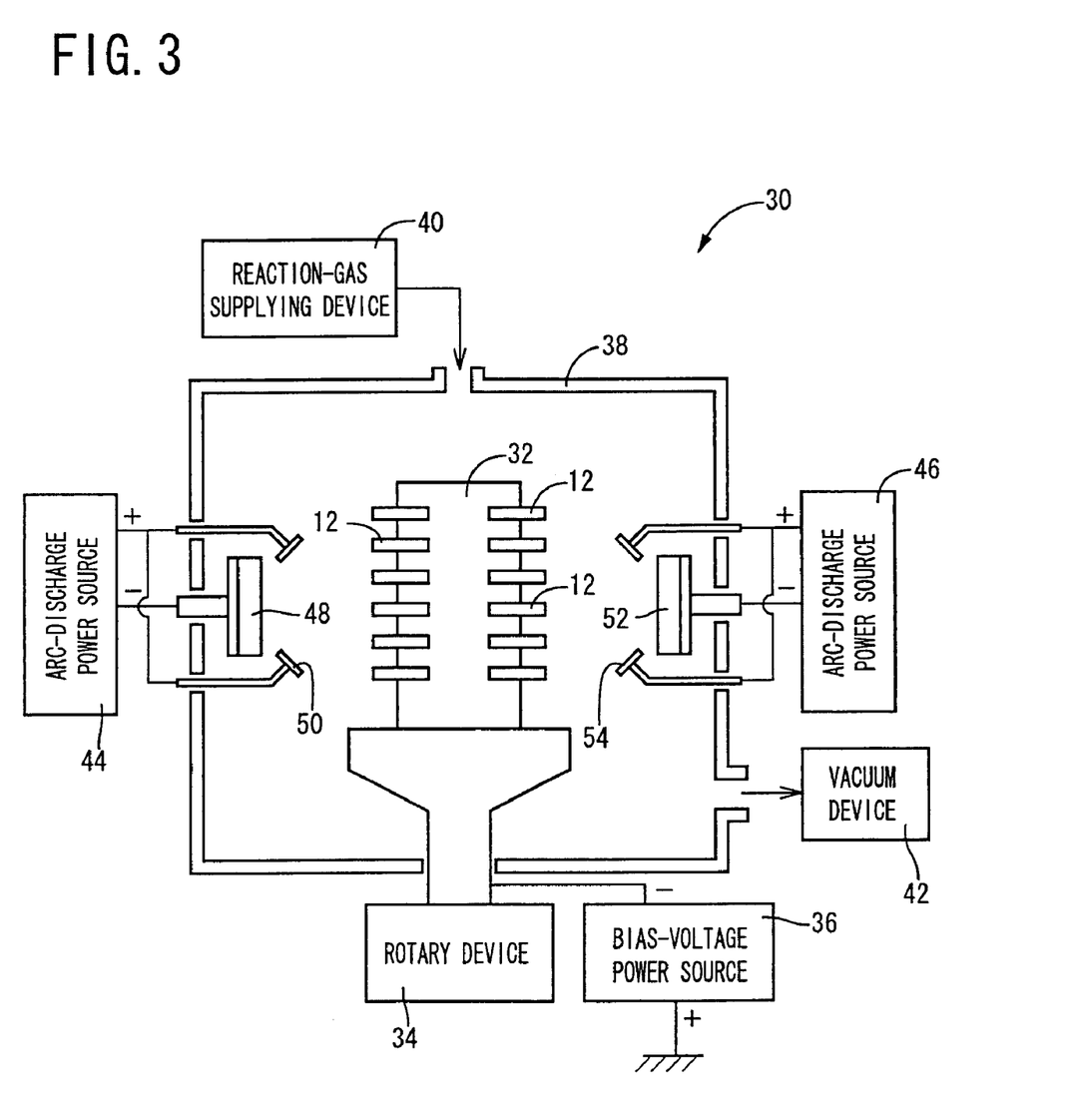
[FIG. 3] A view schematically showing, by way of example, an arc-type ion plating apparatus that is capable of advantageously forming the hard multilayer coatings of FIGS. 1 and 2.

On the other hand, FIG. 3 is a schematic view (schematic diagram) showing an arc-type ion plating apparatus 30 which can be advantageously used for forming the hard multilayer coating 20 or 28. The arc-type ion plating apparatus 30 includes: a holding member 32 for holding a multiplicity of intermediate products in the form of the substrates 12 each of which is not yet coated with the hard multilayer coating 20 or 28 and has the cutting edges 16, 18 already formed therein; a rotary device 34 for rotating the holding member 32 about a rotation axis which extends substantially in a vertical direction; a bias-voltage power source 36 for applying a negative bias voltage to the substrates 12; a processing vessel in the form of a chamber 38 which accommodates therein the substrates 12; first and second arc-discharge power sources 44, 46; a reaction-gas supplying device 40 for supplying a reaction gas into the chamber 38; and a vacuum device 42 for sucking a gas in the interior of the reactor 22 with, for example, a vacuum pump so as to reduce the pressure in the interior of the chamber 38. The holding member 32 consists of a cylindrical or prism member having a center at the above-described rotation axis. The multiplicity of substrates 12 are held by the holding member 32 such that each substrate 12 takes a substantially horizontal posture with the cutting teeth portion 14 protruding outwardly in a radial direction of the holding member 32. The reaction-gas supplying device 40 is equipped with a tank in which nitrogen gas ($N_2$) is stored, so that nitride of TiAl and nitride of Cr can be formed by supplying the nitrogen gas into the chamber 38. It is noted that, where carbonitride of TiAl and carbonitride of Cr are to be formed, a tank storing therein hydrocarbon gas ($CH_4$, $C_2H_2$, etc.) is provided so that the hydrocarbon gas as well as the nitrogen gas is supplied.

The first arc-discharge power source 44 is connected to a first evaporation source (target) 48 as a cathode that is formed of TiAl alloy constituting TiAlN contained in the TiAlN layers 22a and the mixture layers 22b, and is connected also to an anode 50. The first arc-discharge power source 44 serves to supply a predetermined amount of an arc current between the first evaporation source 48 and the anode 50, for causing arc discharge therebetween, so that TiAl is evaporated from the first evaporation source 48. The evaporated TiAl becomes metallic ions (positive ions), and then adheres to the tool substrates 12 to which the negative bias voltage is applied by the bias-voltage power source 36. Similarly, the second arc-discharge power source 46 is connected to a second evaporation source (target) 52 as a cathode that is formed of Cr constituting CrN contained in the mixture layers 22b, the intermediate layer 24 and the CrN layer 26, and is connected also to an anode 54. The second arc-discharge power source 46 serves to supply a predetermined amount of an arc current between the second evaporation source 52 and the anode 54, for causing arc discharge therebetween, so that Cr is evaporated from the second evaporation source 52. The evaporated Cr becomes metallic ions (positive ions), and then adheres to the tool substrates 12 to which the negative bias voltage is applied by the bias-voltage power source 36.

When the hard multilayer coating 20 or 28 is to be formed on a surface of the cutting teeth portion 14 of the tool substrate 12, by using the arc-type ion plating apparatus 30, the pressure in the interior of the chamber 38 is held in a predetermined value (which ranges, for example, from $1.33 \times 5 \times 10^{-1}$ Pa to $1.33 \times 40 \times 10^{-1}$ Pa) by the reaction-gas supplying device 40 and the vacuum device 42, while a predetermined value of the negative bias voltage (which ranges, for example, from −50V to −150V) is applied to the tool substrate 12 by the bias-voltage power source 36. In this instance, the vacuum device 42 vacuums the chamber 30, and at the same time the reaction-gas supplying device 40 supplies the reaction gas into the chamber 30 in such a manner that holds the pressure in the interior of the chamber 30 in the above-described predetermined value. Then, while the rotary device 34 is activated to rotate the holding member 32 at a predetermined number of revolutions (for example, 3 $\text{min}^{-1}$), the hard multilayer coating 20 or 28 is formed on the tool substrate 12, by selectively energizing (ON) and deenergizing (OFF) the first and second arc-discharge power sources 44, 46.

Described specifically, when the first arc-discharge power source 44 is kept ON (energized) while the second arc-discharge power source 46 is kept OFF (deenergized), the arc current is supplied between the first evaporation source 48 and the anode 50 so as to cause a metal ion of TiAl to be emitted from the first evaporation source 48. The emitted metal ion of TiAl reacts with the nitrogen gas, so that TiAlN is formed and adheres to the surface of the tool substrate 12, whereby the TiAlN layer 22a can be formed. The value of the arc current supplied by the first arc-discharge power source 44 and the power-on time for which the first arc-discharge power source 44 is kept ON are determined based on the desired thickness of the TiAlN layer 22a.

Further, when the second arc-discharge power source 46 is kept ON (energized) while the first arc-discharge power source 44 is kept OFF (deenergized), the arc current is supplied between the second evaporation source 52 and the anode 54 so as to cause a metal ion of Cr to be emitted from the first evaporation source 48. The emitted metal ion of Cr reacts with the nitrogen gas, so that CrN is formed and adheres to the surface of the tool substrate 12, whereby the CrN layer 26 can be formed. The value of the arc current supplied by the second arc-discharge power source 46 and the power-on time for which the second arc-discharge power source 46 is kept ON are determined based on the desired thickness of the CrN layer 26.

Further, when the first and second arc-discharge power sources 44, 46 are both kept ON (energized), the arc current is supplied between the first evaporation source 48 and the anode 50 while the arc current is supplied between the second evaporation source 52 and the anode 54. In this case, the metal ion of TiAl is emitted from the first evaporation source 48 while the metal ion of Cr is emitted from the second evaporation source 52. The emitted metal ion of TiAl and metal ion of Cr react with the nitrogen gas, so that the TiAlN and CrN are formed and adhere to the surface of the tool substrate 12. Since the first evaporation source 48 and the second evaporation source 52 are disposed on respective opposite sides of the holding member 32, TiAlN and CrN alternately adhere to the surface of the tool substrate 12 as the holding member 32 is rotated, so that it is possible to form the mixture layer 22b and the intermediate layer 24 in which TiAlN and CrN are mixed to each other. The power-on times for which the first and second arc-discharge power sources 44, 46 are kept ON are determined based on the desired thicknesses of the mixture layer 22b and the intermediate layer 24. The values of the arc currents supplied by the first and second arc-discharge power sources 44, 46 are determined based on the desired thicknesses of the mixture layer 22b and the intermediate layer 24 and mixing ratio between TiAlN and CrN.

Thus, by switching each of the first and second arc-discharge power sources 44, 46 between its energized and deenergized states (ON and OFF states), it is possible to continuously form the backing layer 22 (including the TiAlN layers 22a and the TiAlN+CrN mixture layers 22b that are alternately superposed on each other), the intermediate layer 24 consisting of the TiAlN+CrN mixture layer, and the CrN layer 26, so that the hard multilayer coating 20, 28 can be disposed on the surface of the tool substrate 12. The operation for formation of the hard multilayer coating 20, 28 such as switching of each of the first and second arc-discharge power sources 44, 46 can be automatically carried out by a control device including a computer.

In the hard multilayer coating 20, 28 of the present embodiments, owing to presence of the backing layer 22 including the TiAlN layers 22a and the TiAlN+CrN mixture layers 22b that are alternately superposed on each other, it is possible to obtain excellent wear resistance and tenacity. Further, since the CrN layer 26 constitutes an uppermost portion of the hard multilayer coating 20, 28 and providing the surface of the hard multilayer coating 20, 28 has a low coefficient of friction, it is possible to improve lubricity and welding resistance. Further, since an oxidation initiation temperature of the CrN layer 26 is as high as about 700° C., excellent characteristics of the coating are stably maintained even in an environment of high temperature.

Therefore, in the ball endmill 10 coated with the hard multilayer coating 20, 28, it is possible to obtain excellent cutting performance and durability in a wide range of use, for example, from a case of cutting a workpiece made of ferrous or non-ferrous (e.g., copper alloy) material having a low hardness and easily weldable, to a case of cutting a workpiece made of a high hardness material such as heat treated steel having a hardness of about 50 HRC. Specifically described, owing to presence of the CrN layer 26, it is possible to restrain wear on each rake face and to restrain change of the rake angle toward the negative side in a late stage of the cutting operation, so that a cutting capacity is satisfactorily maintained for a long term, thereby improving the durability of the tool and stabilizing the quality of the finished surface of the workpiece. The ball endmill 10 has a distal end portion which is located around its axis of rotation, and the workpiece is easily weldable to the distal end portion due to a low cutting capacity of the distal end portion. However, owing to the presence of the CrN layer 26, the welding can be restrained whereby the cutting performance and the durability can be satisfactorily maintained. Further, since the excellent characteristics of the coating can be stably obtained even in the environment of high temperature, the cutting tool is capable of carrying out a cutting operation with high efficiency under a tough cutting condition with a high temperature caused by, for example, frictional heat.

In the present embodiments in which each of the lowermost layer and the uppermost layer of the backing layer 22 is provided by the TiAlN layer 22a, the backing layer 22 can be adhered to the tool substrate 12 with excellent adhesiveness owing to the TiAlN layer 22a providing the lowermost layer, while the backing layer 22 can have excellent wear resistance owing to the TiAlN layer 22a providing the uppermost layer. Since the CrN layer 26 is disposed on the TiAlN layer 22a providing the uppermost layer directly or through the intermediate layer 24, the TiAlN layer 22a having the high hardness is not brought into direct contact with the workpiece. However, the TiAlN layer 22a serves to restrain deformation of the CrN layer 26, so that wear resistance of the CrN layer 26 is improved.

Further, in the hard multilayer coating 20 of FIG. 1, since the intermediate layer 24 consisting of the TiAlN+CrN mixture layer (containing CrN) is interposed between the backing layer 22 and the CrN layer 26, the CrN layer 26 is superposed with high adhesiveness with respect to the backing layer 22 whose uppermost layer is provided by the TiAlN layer 22a, so that chipping and peeling of the CrN layer 26 can be further advantageously restrained.

Further, in the hard multilayer coating 20, 28 of the present embodiments, since the entire thickness of the coating 20, 28 is not larger than 10 μm, it is possible to restrain the peeling of the coating 20, 28 from the tool substrate 12, so as to obtain excellent adhesiveness between the coating 20, 28 and the tool substrate 12. In addition, owing to the entire thickness being not larger than 10 μm, it is also possible to avoid the peripheral and ball-nosed end cutting edges 16, 18 from being rounded, so that deterioration of the cutting performance is prevented. Meanwhile, since the entire thickness of the coating 20, 28 is not smaller than 2.2 μm, it is possible to obtain predetermined coating strength and performance. That is, since the thickness of the backing layer 22 is not smaller than 2 μm, it is possible to obtain coating performance and strength required to the backing layer 22 such as sufficient wear resistance, heat resistance and tenacity. Moreover, since the thickness of each of the intermediate layer 24 and the CrN layer 26 is not smaller than 0.1 μm, it is possible to obtain coating performance such as sufficient adhesiveness and lubricity.

Figure 5:
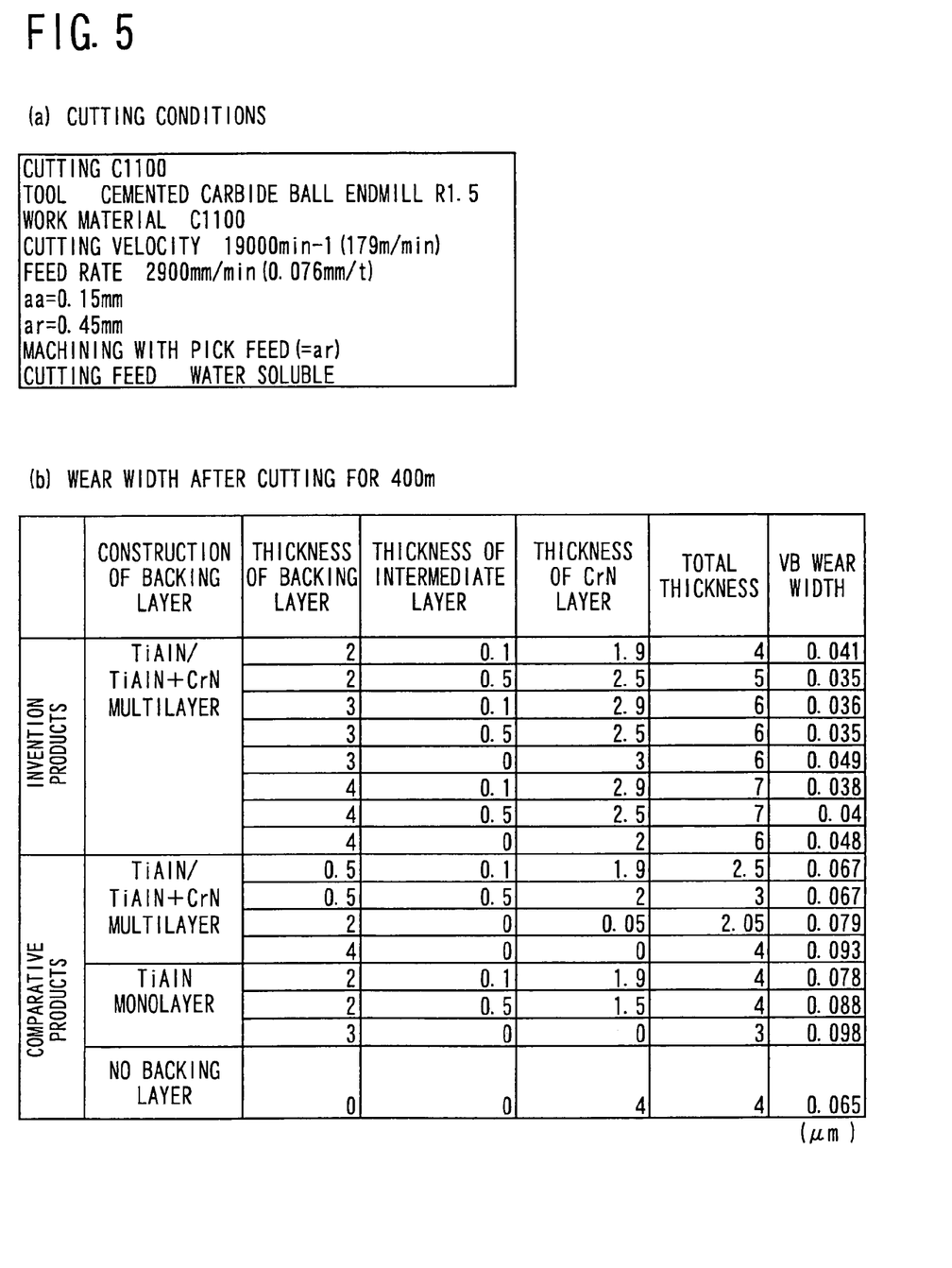
[FIG. 5] A set of views for explaining result of measurement of width of flank wear on each of coated cutting tools (including invention products and comparative products) that are different from each other with respect to composition of coating, wherein the measurement was made after each coated cutting tool was used for cutting C1100 (copper) at predetermined cutting conditions.

FIG. 5 is a set of views showing result of measurement of VB wear width (width of flank wear) on each of the ball endmills 10 having the respective ball-nosed end cutting edges 18 whose radius R is 1.5 mm, wherein the measurement was made after each ball endmill 10 was used for cutting C1100 (JIS: copper) for a distance of 400 mm under cutting conditions indicated in view (a) of FIG. 5. The ball endmills 10 had respective various coatings indicated in view (b) of FIG. 5. As shown in view (b) of FIG. 5, the VB wear widths on the present invention products ranged from 0.035 μm to 0.049 μm, so that it can be understood that the invention products have wear resistance improved over the comparative products and also excellent durability even against an easily weldable workpiece such as copper. For example, the durability of each of the invention products is at least twice as high as the durability of the comparative product (conventional product) with the coating consisting of only the backing layer 22 having a multilayered construction, since the VB wear width on that comparative product was 0.093 μm. It is noted that, in the comparative products as well as in the invention products, each of the uppermost and lowermost layers of the backing layer 22 having the multilayered construction (in which the TiAlN layers 22a and the TiAlN+CrN mixture layers 22b are alternately superposed on each other) is provided by the TiAlN layer 22a.

Figure 6:
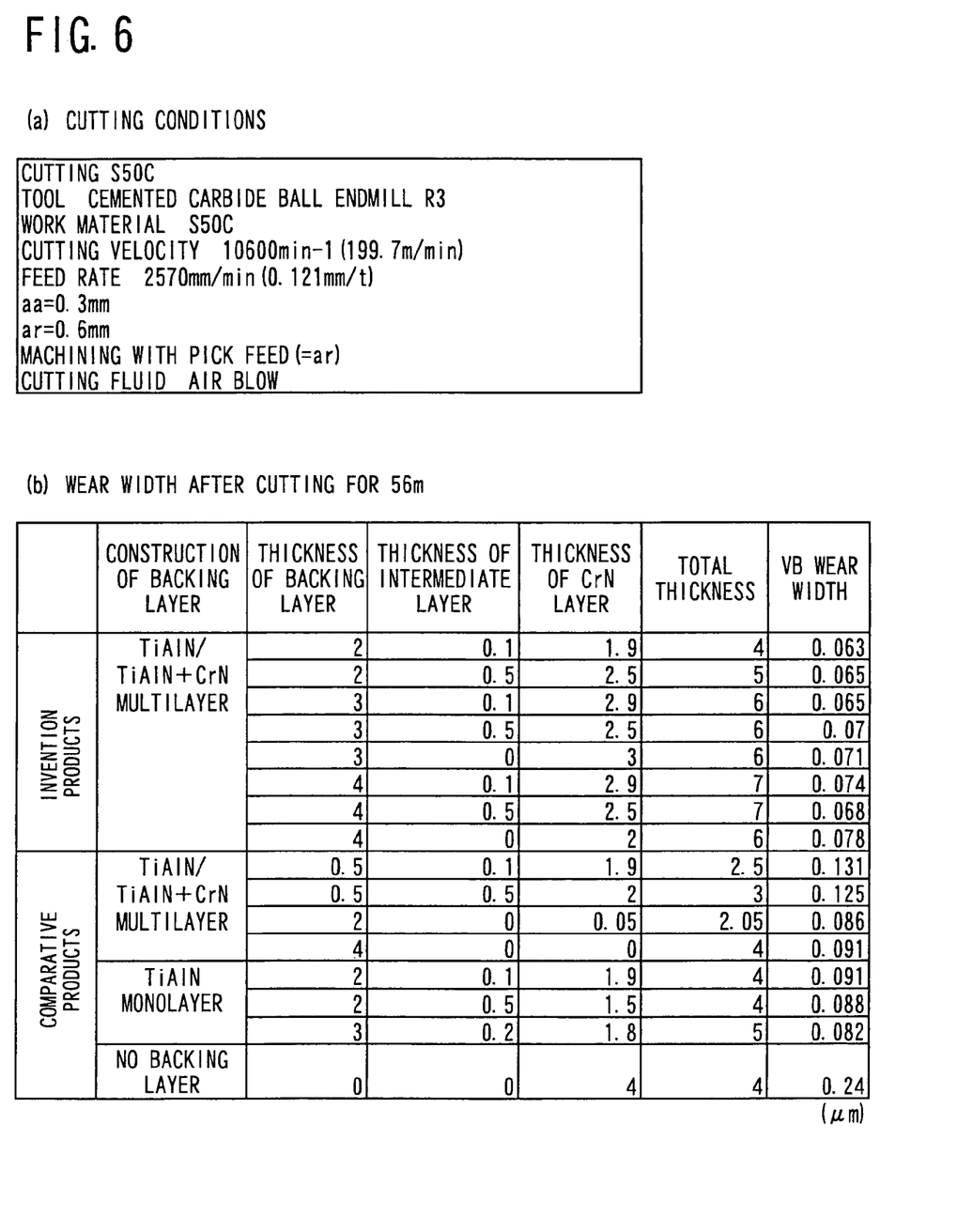
[FIG. 6] A set of views for explaining result of measurement of width of flank wear on each of coated cutting tools (including invention products and comparative products) that are different from each other with respect to composition of coating, wherein the measurement was made after each coated cutting tool was used for cutting S50C (carbon steel for machine structural use) at predetermined cutting conditions.

FIG. 6 is a set of views showing result of measurement of VB wear width (width of flank wear) on each of the ball endmills 10 having the respective ball-nosed end cutting edges 18 whose radius R is 3 mm, wherein the measurement was made after each ball endmill 10 was used for cutting S50C (JIS: carbon steel for machine structural use) for a distance of 56 mm under cutting conditions indicated in view (a) of FIG. 6. The ball endmills 10 had respective various coatings indicated in view (b) of FIG. 6. As shown in view (b) of FIG. 6, the VB wear widths on the present invention products ranged from 0.063 μm to 0.078 μm, so that it can be understood that the invention products have wear resistance improved over the comparative products and also excellent durability even against a workpiece made of a high hardness material such as carbon steel. For example, the durability of each of the invention products is improved by 10% over the comparative product (conventional product) with the coating consisting of only the backing layer 22 having a multilayered construction, since the VB wear width on that comparative product was 0.091 μm. It is noted that, in the comparative products as well as in the invention products, each of the uppermost and lowermost layers of the backing layer 22 having the multilayered construction (in which the TiAlN layers 22a and the TiAlN+CrN mixture layers 22b are alternately superposed on each other) is provided by the TiAlN layer 22a.

While the presently preferred embodiments of the present invention have been illustrated above, it is to be understood that the invention is not limited to the details of the illustrated embodiments, but may be embodied with various other changes, modifications and improvements, which may occur to those skilled in the art, without departing from the spirit and scope of the invention defined in the following claims.

INDUSTRIAL APPLICABILITY

Since the hard multilayer coating of the present invention has sufficient wear resistance and welding resistance, where the hard multilayer coating is disposed on a surface of a tool substrate of a rotary cutting tool or the like, it is possible to obtain excellent cutting performance and durability in a wide range of use, for example, from a case of cutting a workpiece made of copper alloy or other material having a low hardness and easily weldable, to a case of cutting a workpiece made of heat treated steel or other material having a high hardness. Therefore, the hard multilayer coating of the present invention is advantageously used as a hard coating that is to be disposed on a surface of a cutting tool such as a ball endmill. In addition, it may be applied also to a coating that is to be provided, for example, as a surface-protecting coating of a body such as an electronic component, which is other than the machining tools.

The invention claimed is:
1. A hard multilayer coating comprising:
a backing layer that is to be disposed on a body, said backing layer including a TiAlN layer and a TiAlN+CrN mixture layer that are alternately superposed on each other;
an intermediate layer disposed on said backing layer and consisting of a TiAlN+CrN mixture layer; and
a CrN layer disposed on said intermediate layer and providing an outer surface of said hard multilayer coating.
2. The hard multilayer coating according to claim 1,
wherein said backing layer has a thickness of from 2 μm to 8 μm;
wherein said intermediate layer has a thickness of from 0.1 μm to 5 μm;
wherein said CrN layer has a thickness of from 0.1 μm to 5 μm; and
and wherein said hard multilayer coating has an entire thickness of not larger than 10 μm.

3. The hard multilayer coating according to claim 1, wherein a lowermost layer and an uppermost layer of said backing layer is provided by said TiAlN layer.

4. The hard multilayer coating according to claim 1, wherein said hard multilayer coating is to be disposed on a surface of a cutting tool.

5. A hard multilayer coated tool comprising:

the hard multilayer coating defined in claim 1;

and a tool substrate that is coated with said hard multilayer coating.

6. A hard multilayer coating comprising:

a backing layer that is to be disposed on a body, said backing layer including a TiAlN layer and a TiAlN+CrN mixture layer that are alternately superposed on each other; and a CrN layer disposed on said backing layer and providing an outer surface of said hard multilayer coating.

7. The hard multilayer coating according to claim 6, wherein said backing layer has a thickness of from 2 µm to 8 µm;

wherein said CrN layer has a thickness of from 0.1 µm to 8 µm; and and wherein said hard multilayer coating has an entire thickness of not larger than 10 µm.

8. The hard multilayer coating according to claim 6, wherein a lowermost layer and an uppermost layer of said backing layer is provided by said TiAlN layer.

9. The hard multilayer coating according to claim 6, wherein said hard multilayer coating is to be disposed on a surface of a cutting tool.

10. A hard multilayer coated tool comprising:

the hard multilayer coating defined in claim 6;

and a tool substrate that is coated with said hard multilayer coating.

\* \* \* \* \*